United States Patent
Sun et al.

(10) Patent No.: US 6,444,539 B1
(45) Date of Patent: Sep. 3, 2002

(54) METHOD FOR PRODUCING A SHALLOW TRENCH ISOLATION FILLED WITH THERMAL OXIDE

(75) Inventors: Yu Sun, Saratoga; Angela T. Hui, Fremont; Yue-Song He, San Jose, all of CA (US); Tatsuya Kajita, Aizuwakamatsu (JP); Mark Chang, Los Altos, CA (US); Chi Chang, Redwood City, CA (US); Hung-Sheng Chen, San Jose, CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/784,892

(22) Filed: Feb. 15, 2001

(51) Int. Cl.⁷ .............................................. H01L 21/76
(52) U.S. Cl. ................. 438/424; 438/425; 438/426; 438/430; 438/435; 438/437; 438/444; 438/438; 438/446; 438/452
(58) Field of Search ................................ 438/196, 207, 438/218, 219, 221, 225, 271, 294, 296, 318, 353, 355, 359, 361, 404, 424, 425–427, 430, 435, 437, 444, 445, 446, 452

(56) References Cited

U.S. PATENT DOCUMENTS

| | | | | |
|---|---|---|---|---|
| 5,173,444 A | * | 12/1992 | Kawamura | 438/445 |
| 5,403,770 A | * | 4/1995 | Jang | 438/439 |
| 5,470,783 A | * | 11/1995 | Chiu et al. | 148/DIG. 50 |
| 5,895,253 A | * | 4/1999 | Akram | 257/374 |
| 5,945,352 A | * | 8/1999 | Chen et al. | 148/DIG. 50 |
| 6,043,135 A | * | 3/2000 | Noda | 438/404 |
| 6,060,394 A | * | 5/2000 | Wu | 216/38 |
| 6,069,057 A | * | 5/2000 | Wu | 148/DIG. 50 |
| 6,096,612 A | * | 8/2000 | Houston | 438/296 |
| 6,097,072 A | * | 8/2000 | Omid-Zohoor | 257/397 |
| 6,097,076 A | * | 8/2000 | Gonzalez et al. | 257/510 |
| 6,297,130 B1 | * | 10/2001 | Rao | 438/444 |

OTHER PUBLICATIONS

V–Shaped Thin Plate Lateral PNP Transistor With a Self Aligned Polysilicon Collector Contact, Dec. 1991, IBM, 34:7B, 443–448.*

* cited by examiner

*Primary Examiner*—Eddie Lee
*Assistant Examiner*—Paul E Brock, II
(74) *Attorney, Agent, or Firm*—LaRiviere, Grubman & Payne, LLP

(57) ABSTRACT

A semiconductor apparatus and method for producing shallow trench isolation. The method includes the steps providing a semiconductor substrate member fabricated having a thin barrier oxide layer on which are fabricated a plurality of spaced apart silicon nitride pads. The regions between the spaced apart nitride pads delineate U-shaped regions for forming shallow isolation trenches and are layered with silicon oxide and polysilicon. The U-shaped regions provide a buffer region of oxide and polysilicon material adjacent opposing silicon nitride pads that prevent erosion of the nitride during etch formation of the isolation trench. The polysilicon is further etched to form a wider, second U-shaped region having sloped sidewalls that provide opposing spacer-forming buffer material that facilitates forming a V-shaped isolation trench region into the semiconductor substrate member a predetermined depth without eroding the silicon nitride pads. The V-shaped trench is subsequently filled with silicon dioxide that is grown by a hot thermal oxide process. The upper portion of the V-shaped isolation trench may be further filled with deposited silicon dioxide followed by a chemical mechanical polishing process.

15 Claims, 4 Drawing Sheets

METHOD FOR PRODUCING A SHALLOW TRENCH ISOLATION FILLED WITH THERMAL OXIDE

RELATED APPLICATION(S)

This application is a divisional patent application of co-pending continued prosecution application (CPA) U.S. patent application Ser. No. 09/082,607, now U.S. Pat No. 6,232,646 entitled SHALLOW TRENCH ISOLATION FILLED WITH THERMAL OXIDE, filed May 17, 2000, in turn, claiming priority to U.S. patent application Ser. No. 09/082,607, also entitled SHALLOW TRENCH ISOLATION FILLED WITH THERMAL OXIDE, filed May 20, 1998, by the same applicants.

TECHNICAL FIELD

The present invention relates to integrated circuits and fabrication techniques for forming field oxide (FOX) regions on the integrated circuit substrate. More particularly, the present invention relates to fabrication techniques for forming shallow trench isolation (STI) regions on the integrated circuit substrate.

BACKGROUND OF THE INVENTION

The processes for fabricating semiconductor devices includes process steps for providing isolation regions that contain dielectric materials that provide the necessary protection for assuring proper function of the formed electronic integrated circuit design. The process includes LOCOS which is localized oxidation of silicon. This process typically begins by depositing a silicon nitride layer over a silicon dioxide layer (barrier oxide) to a thickness in the range of 0.05 $\mu$m. to 0.10 $\mu$m. The silicon nitride is typically deposited using low-pressure chemical vapor deposition (LPCVD) techniques. A photoresist mask layer, comprising any appropriate commercially available photoresist material known in the industry, is then deposited over the silicon nitride layer The photoresist mask layer is then patterned for forming isolation trenches. Upon etching, the isolation trench regions are formed adjacent silicon oxide layer and the silicon nitride layer and a portion of the photoresist layer. Typically, in order to form the trench regions, the upper surface of the substrate is etched a small amount, approximately 0.25 $\mu$m. An oxide layer is formed in the isolation regions by depositing a thick pad of silicon dioxide using tetraethylorthosilicate (TEOS) as the source for deposition of silicon dioxide. The thickness of the oxide pad, also referred to as a field oxide (FOX) pad, is in the range of 1.2 $\mu$m to 1.5 $\mu$m. The process further includes polishing of the formed isolation pads to a surface level and thickness substantially even with the silicon nitride level. Subsequent to formation of the oxide pads the silicon nitride and silicon dioxide layer regions are removed by wet etching to expose the active region which will be used to form the various integrated circuit components. The wet etching is typically done using hot phosphoric acid to first etch the silicon nitride layer, then by dipping the substrate in a hydrofluoric acid (HF) dip to etch the silicon dioxide layer.

As seen from the foregoing, formation of the trench region, in accordance with prior art techniques, erodes the adjacent barrier oxide and silicon nitride layers protecting the active regions. Thus, a need is seen to exist for a method of forming the isolation trenches without eroding the adjacent silicon nitride pads and barrier oxide that overlay the active regions of the semiconductor structure.

Accordingly, a primary object of the present invention is to provide a method for forming isolation trenches such that the adjacent structure protecting the active semiconductor substrate is not eroded during etching processes used to form the trench regions.

BRIEF SUMMARY OF THE INVENTION

Accordingly, the foregoing object is accomplished by providing a semiconductor substrate member fabricated having a thin barrier oxide layer on which are fabricated a plurality of spaced apart silicon nitride pads. The regions between the spaced apart nitride pads delineate U-shaped regions for forming shallow isolation trenches and are layered with silicon oxide and polysilicon. The U-shaped regions provide a buffer region of oxide and polysilicon material adjacent opposing silicon nitride pads that prevent erosion of the nitride during etch formation of the isolation trench. The polysilicon is further etched to form a wider, second U-shaped region having sloped sidewalls that provide opposing spacerforming buffer material that facilitates forming a V-shaped isolation trench region into the semiconductor substrate member a predetermined depth without eroding the silicon nitride pads. The V-shaped trench is subsequently filled with silicon dioxide that is grown by a hot thermal oxide process. The upper portion of the V-shaped isolation trench may be further filled with deposited silicon dioxide followed by a chemical mechanical polishing process.

Other features of the present invention are disclosed or apparent in the section entitled: "DETAILED DESCRIPTION OF THE INVENTION".

BRIEF DESCRIPTION OF DRAWINGS

For fuller understanding of the present invention, reference is made to the accompanying drawings and the following Detailed Description of the Invention. In the drawings.

Figure 1:
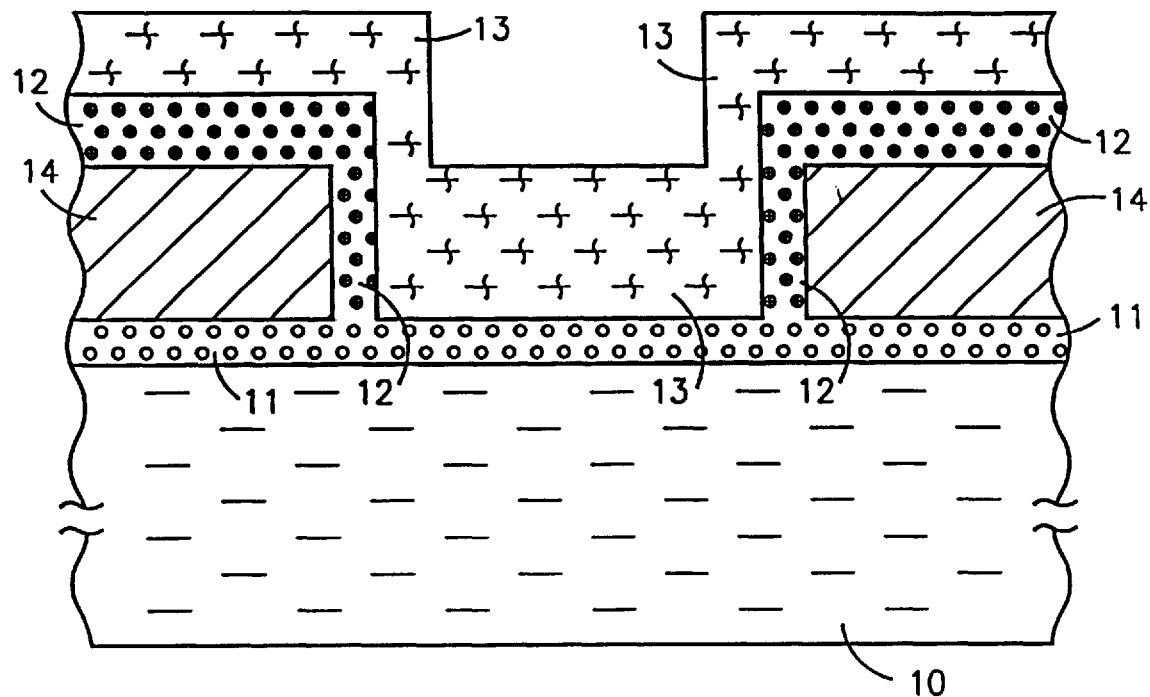
FIG. 1 is a cross-sectional view of first U-shaped notch in a region delineated for forming shallow isolation trenches in accordance with the present invention.

Reference numbers refer to the same or equivalent parts of the present invention throughout the several figures of the drawing.

DETAILED DESCRIPTION OF THE INVENTION

FIGS. 1–5 comprise trench isolation fabrication steps for use in fabrication of the shallow trench isolation structure in accordance with the present invention. As shown in FIG. 1, a semiconductor substrate member 10 has been fabricated to a stage such that a barrier oxide layer 11, comprising a first silicon dioxide layer, has been formed overlaying silicon substrate 10. FIG. 1 also shows a plurality of spaced apart silicon nitride pads 14 that have been fabricated over portions of barrier oxide layer 11. Subsequent to formation of the nitride layers pads 14, a second silicon layer 12 comprising, by example, a hot thermal oxide, is grown over, and on sidewall portions, of the silicon nitride pads 14, as well as over portions of barrier oxide 11 in the regions between the silicon nitride pads 14. The regions between silicon nitride pads 14 comprising regions for forming shallow isolation trenches. After formation of the hot thermal oxide layer 12 a polysilicon layer 13 is formed over the oxide layer 12 such that the polysilicon layer 13 forms a first U-shaped notch in the region delineated for forming said shallow isolation trenches. The material comprising the polysilicon 13 and hot thermal oxide 12 provides a buffer region for shaping the isolation trench and protecting the corners of the nitride pads 14 during an etching process step.

Figure 2:
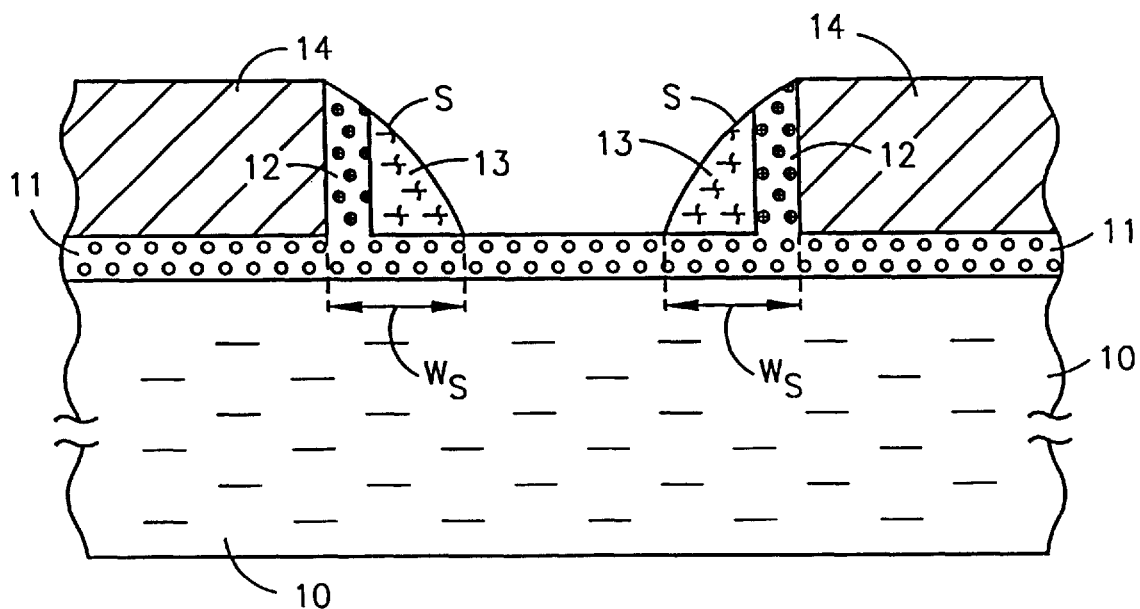
FIG. 2 is a cross-sectional view of a second U-shaped notch having sloped sidewalls that form opposing spacer region comprising tapering amounts of oxide and polysilicon material that prevent erosion of the silicon nitride pads.
Figure 3:
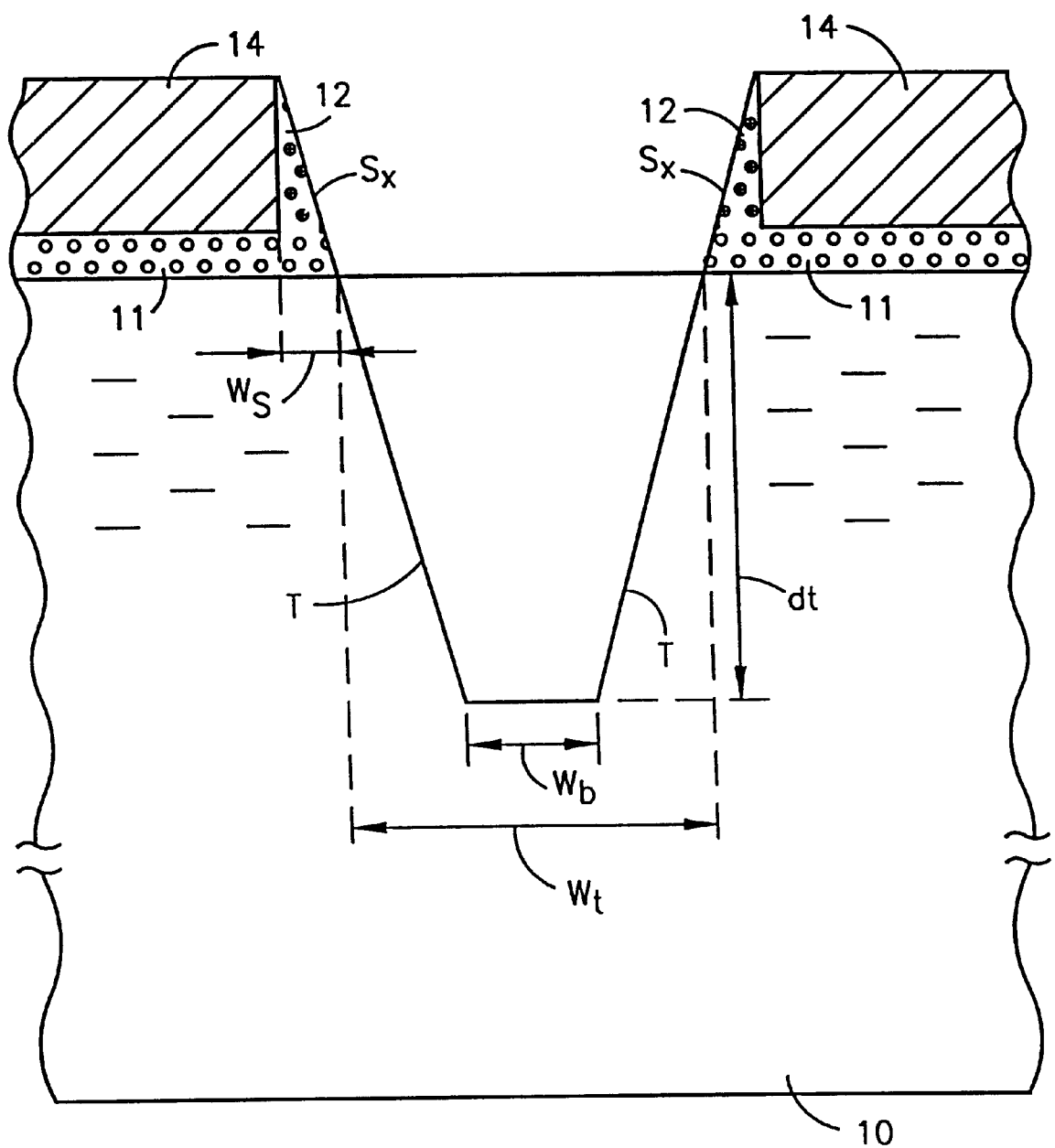
FIG. 3 is a cross-sectional view of a V-shaped isolation trench region fabricated into said semiconductor substrate member in accordance with the present invention.
Figure 4:
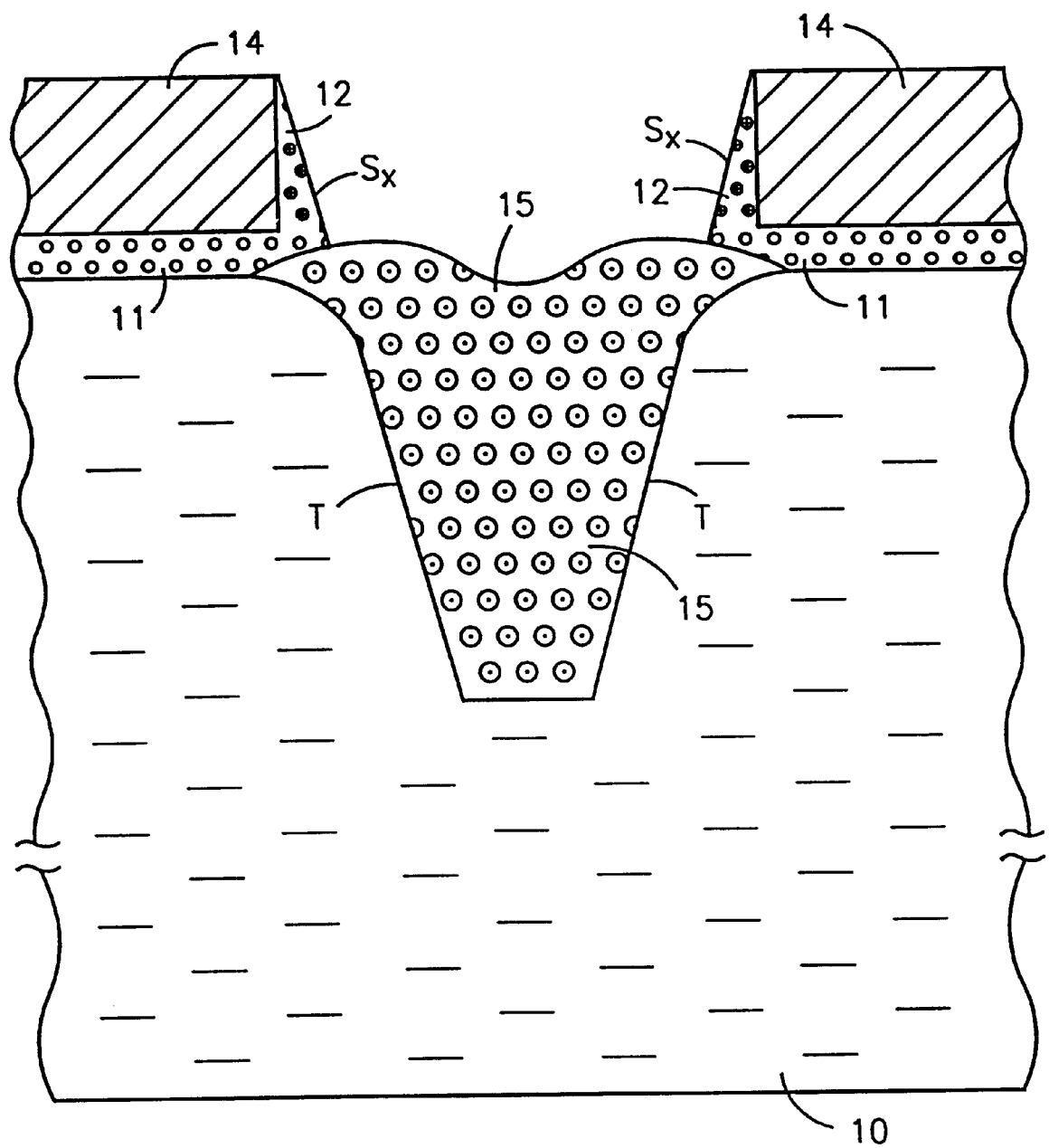
FIG. 4 is a cross-sectional view of a V-shaped isolation trench region formed as shown in FIG. 3 and further showing a trench isolation material comprising silicon dioxide grown within a substantial portion of the V-shaped trench region.
Figure 5:
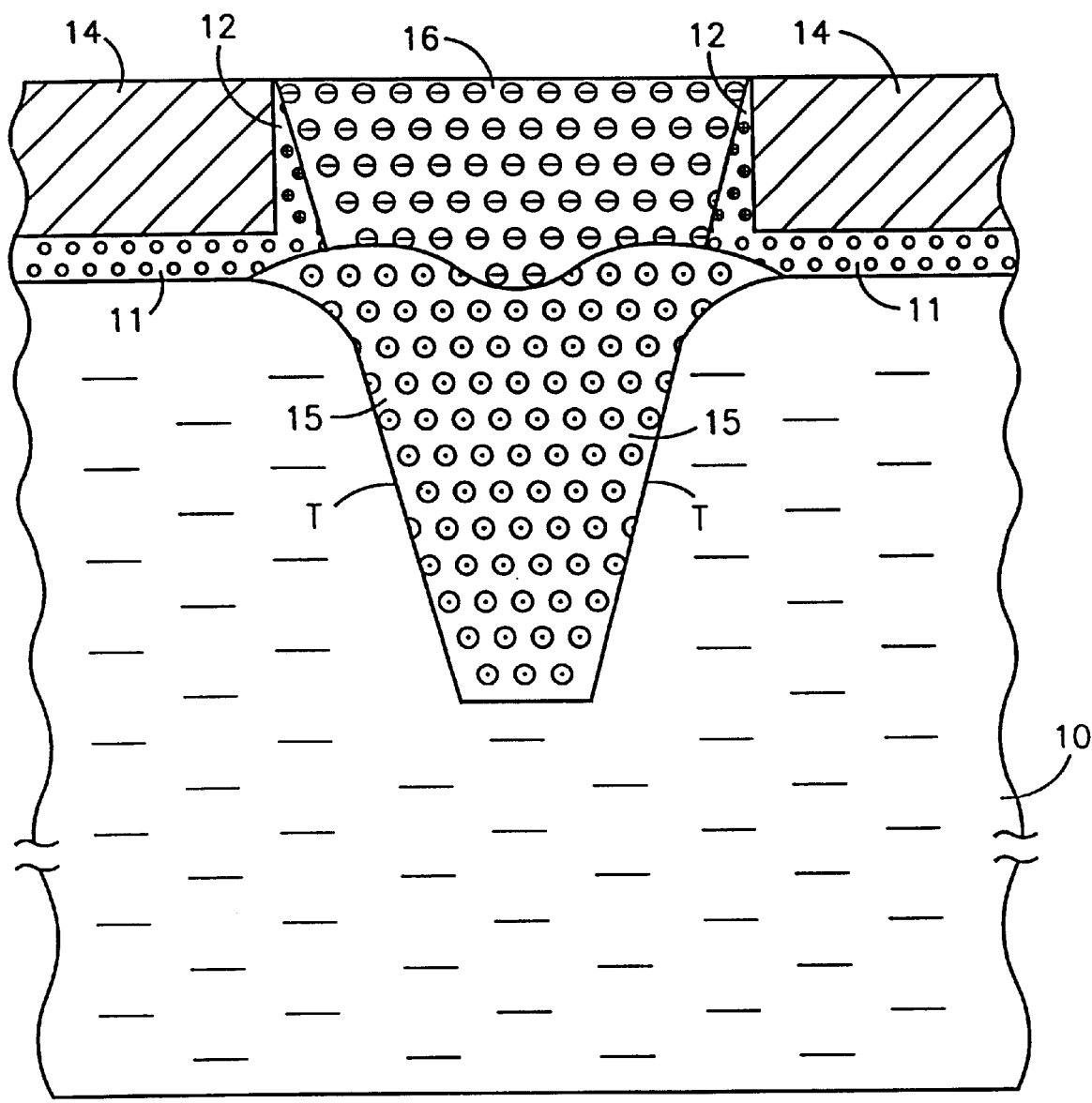
FIG. 5 is a cross-sectional view of a V-shaped isolation trench region formed as shown in FIG. 4 further showing an upper end of the V-shaped isolation trench region with deposited silicon dioxide material in accordance with the present invention.

FIG. 2 shows a first etching step that shapes the first U-shaped notch of polysilicon material such that a wider, second U-shaped notch is formed. The second U-shaped notch is formed such that spacers S are formed comprising buffer material region of oxide and polysilicon material that offset the nitride pads a varying distance Ws. As best seen in FIG. 3, spacers S facilitate forming a V-shaped isolation trench region T into semiconductor substrate member 10. The width Ws of spacers S are reduced by etching action while isolation trench region T is being fabricated. Basically, all of the polysilicon material, comprising sidewalls of the second U-shaped notch, are etched away during formation of trench T, leaving a remaining oxide spacer Sx. The V-shaped isolation trench structure comprises an upper end portion forming an opening having a width Wt measuring, by example 0.2 $\mu$m, and a bottom end portion having a width Wb measuring substantially less than 0.2 $\mu$m. The V-shaped trench T is etched into semiconductor substrate 10 a predetermined depth dt ranging from 500 Å to 2000 Å. Subsequent to formation of trench T, an isolation material 15 is grown from the opposing silicon sidewall structure in the trench region. The isolation material 15 is grown, by example using a hot thermal oxide HTO process. The oxide material 11, 12 in the upper trench region gets thicker during the HTO process. The extremely small dimensions associated with trench structure T facilitate a pinching effect of the oxide material being grown to fill the trench region. FIG. 4 shows oxide material 15 filling a substantial portion of the V-shaped trench T. Also as seen in FIG. 4, the upper portion of the V-shaped trench adjacent the spacers Sx are void of oxide material. FIG. 5 shows additional oxide material 16 deposited over oxide material 15 to complete formation and filling of trench T. The additional oxide material is deposited by industry known chemical vapor deposition method. A roughness in the structure is polished by chemical mechanical polishing techniques.

The present invention has been particularly shown and described with respect to a certain preferred embodiment and features thereof. However, it should be readily apparent to those of ordinary skill in the art that various changes and modifications in form, semiconductor material, material conductivity type i.e. N-type, or P-type, and detail may be made without departing from the spirit and scope of the inventions as set forth in the appended claims. The inventions illustratively disclosed herein may be practiced without any element which is not specifically disclosed herein.

What is claimed is:

1. A method for producing at least one shallow trench isolation, said method comprising the steps of:

(a) providing a semiconductor substrate member having a barrier oxide layer;

(b) forming at least one pair of spaced apart first dielectric pads on said barrier oxide layer;

(c) forming a silicon layer over said first dielectric pads and over said barrier oxide layer in regions between said first dielectric pads, said regions between said first dielectric pads comprising regions for forming said at least one shallow trench isolation;

(d) forming a polysilicon layer over said silicon layer, said polysilicon layer forming a first U-shaped notch in said region delineated for forming said at least one shallow trench isolation and providing a first buffer region comprising an oxide and a polysilicon material adjacent said at least one pair of spaced apart first dielectric pads;

(e) forming, by a polysilicon etching process, a wider, second U-shaped notch in said region delineated for forming said at least one shallow trench isolation, said second U-shaped notch having sloped sidewalls that form a second buffer region comprising tapering amounts of an oxide and a polysilicon material; and (f) forming a V-shaped isolation trench region into said semiconductor substrate member, said V-shaped isolation trench region being formed by etching the polysilicon material comprising sidewalls of said second U-shaped notch, by etching through said barrier oxide and into said semiconductor substrate member a predetermined depth.

2. The method for producing at least one shallow trench isolation, as recited in claim 1, wherein said step (f) comprises forming said second buffer region comprising having varying thicknesses of oxide material adjacent said at least one pair of spaced apart first dielectric pads, said second buffer region comprising an upper end sidewall portion of said V-shaped isolation trench region.

3. The method for producing at least one shallow trench isolation, as recited in claim 1, further comprising the step of growing a trench isolation material comprising a first thermal oxide material within a substantial portion of said V-shaped isolation trench region.

4. The method for producing at least one shallow trench isolation, as recited in claim 3, further comprising the step of depositing, by chemical vapor deposition process, a second thermal oxide material at an upper end portion of said V-shaped isolation trench region.

5. A method for producing at least one shallow trench isolation, said method comprising the steps of:

(a) providing a semiconductor substrate member having a barrier oxide layer;

(b) forming at least one pair of spaced apart first dielectric pads on said barrier oxide layer;

(c) forming a silicon layer over said first dielectric pads and over said barrier oxide layer in regions between said first dielectric pads, said regions said first dielectric pads comprising regions for forming said at least one shallow trench isolation;

(d) forming a polysilicon layer over said silicon layer, said polysilicon layer forming a first U-shaped notch in said region delineated for forming said at least one shallow trench isolation and providing a first buffer region comprising an oxide and a polysilicon material adjacent said at least one pair of spaced apart first dielectric pads;

(e) forming, by a polysilicon etching process, a wider, second U-shaped notch in said region delineated for forming said at least one shallow trench isolation, said second U-shaped notch having sloped sidewalls that form a second buffer region comprising tapering amounts of an oxide and a polysilicon material;

(f) forming a V-shaped isolation trench region into said semiconductor substrate member, said V-shaped isolation trench region being formed by etching the polysilicon material comprising sidewalls of said second U-shaped notch, by etching through said barrier oxide and into said semiconductor substrate member a predetermined depth; and (g) growing a trench isolation material comprising a first thermal oxide being grown within a substantial portion of said V-shaped isolation trench region.

6. The method for producing shallow trench isolation, as recited in claim 5, further comprising the step of depositing, by chemical vapor deposition process, a second thermal oxide material at an upper end portion of said V-shaped isolation trench region.

7. The method for producing at least one shallow trench isolation, as recited in claim 1, wherein said at least one pair of spaced apart first dielectric pads comprises silicon nitride ($Si_3N_4$).

8. The method for producing at least one shallow trench isolation, as recited in claim 5, wherein said barrier oxide layer comprises silicon dioxide ($SiO_2$).

9. The method for producing at least one shallow trench isolation, as recited in claim 1, wherein said at least one shallow trench isolation comprises a V-shape having at least one rounded top corner and at least one sharp bottom corner.

10. The method for producing at least one shallow trench isolation, as recited in claim 5, wherein said at least one shallow trench isolation comprises a V-shape having at least one rounded top corner and at least one sharp bottom corner.

11. The method for producing at least one shallow trench isolation, as recited in claim 3, wherein said first thermal oxide comprises silicon dioxide ($SiO_2$).

12. The method for producing at least one shallow trench isolation, as recited in claim 4, wherein said second thermal oxide comprises silicon dioxide ($SiO_2$).

13. The method for producing at least one shallow trench isolation, as recited in claim 5, wherein said first thermal oxide comprises silicon dioxide ($SiO_2$).

14. The method for producing at least one shallow trench isolation, as recited in claim 6, wherein said second thermal oxide comprises silicon dioxide ($SiO_2$).

15. A method for producing at least one shallow trench isolation, said method comprising the steps of:

(a) providing a semiconductor substrate member having a barrier oxide layer;

(b) forming at least one pair of spaced apart first dielectric pads on said barrier oxide layer;

(c) forming a silicon layer over said first dielectric pads and over said barrier oxide layer in regions between said first dielectric pads, said regions between said first dielectric pads comprising regions for forming said at least one shallow trench isolation;

(d) forming a polysilicon layer over said silicon layer, said polysilicon layer forming a first U-shaped notch in said region delineated for forming said at least one shallow trench isolation and providing a first buffer region comprising an oxide and a polysilicon material adjacent said at least one pair of spaced apart first dielectric pads;

(e) forming, by a polysilicon etching process, a wider, second U-shaped notch in said region delineated for forming said at least one shallow trench isolation, said second U-shaped notch having sloped sidewalls that form a second buffer region comprising tapering amounts of an oxide and a polysilicon material;

(f) forming a V-shaped isolation trench region into said semiconductor substrate member, said V-shaped isolation trench region being formed by etching the polysilicon material comprising sidewalls of said second U-shaped notch, by etching through said barrier oxide and into said semiconductor substrate member a predetermined depth;

(g) growing a trench isolation material comprising a first thermal oxide material being grown within a substantial portion of said V-shaped isolation trench region; and (h) depositing, by chemical vapor deposition process, a second thermal oxide material at an upper end portion of said V-shaped isolation trench region, wherein said at least one pair of spaced apart first dielectric pads comprises silicon nitride ($Si_3N_4$), wherein said barrier oxide layer comprises silicon dioxide ($SiO_2$), wherein said first thermal oxide comprises silicon dioxide ($SiO_2$), wherein said second thermal oxide comprises silicon dioxide ($SiO_2$), and wherein said at least one shallow trench isolation comprises a V-shape having at least one rounded top corner and at least one sharp bottom corner.

* * * * *